United States Patent
Sleigh et al.

(10) Patent No.: US 7,288,969 B1
(45) Date of Patent: Oct. 30, 2007

(54) ZERO CLOCK DELAY METASTABILITY FILTERING CIRCUIT

(75) Inventors: Todd Richard Sleigh, Kanata (CA); Steve Driediger, Kanata (CA)

(73) Assignee: Alcatel Lucent, Paris (FR)

( * ) Notice: Subject to any disclaimer, the term of this patent is extended or adjusted under 35 U.S.C. 154(b) by 73 days.

(21) Appl. No.: 11/397,570

(22) Filed: Apr. 5, 2006

(51) Int. Cl.
*H03K 5/22* (2006.01)

(52) U.S. Cl. .......................... 326/94; 327/24
(58) Field of Classification Search ............. 326/93–98
See application file for complete search history.

(56) References Cited

U.S. PATENT DOCUMENTS

| | | | | |
|---|---|---|---|---|
| 4,851,710 A | * | 7/1989 | Grivna | 327/155 |
| 5,128,970 A | * | 7/1992 | Murphy | 375/354 |
| 5,172,397 A | * | 12/1992 | Llewellyn | 375/359 |
| 5,896,052 A | * | 4/1999 | Gujral et al. | 327/144 |
| 6,055,285 A | * | 4/2000 | Alston | 375/372 |
| 6,247,137 B1 | * | 6/2001 | Wickeraad | 713/401 |
| 6,584,536 B1 | * | 6/2003 | Deng | 710/310 |
| 6,853,696 B1 | * | 2/2005 | Moser et al. | 375/375 |
| 6,906,555 B2 | * | 6/2005 | Ma | 326/94 |
| 2002/0050842 A1 | * | 5/2002 | Soda | 327/24 |
| 2006/0044022 A1 | * | 3/2006 | Tayler et al. | 327/24 |
| 2006/0091912 A1 | * | 5/2006 | Ghosh et al. | 326/93 |

* cited by examiner

*Primary Examiner*—Rexford Barnie
*Assistant Examiner*—Thienvu Tran
(74) *Attorney, Agent, or Firm*—Kramer & Amado, P.C.

(57) ABSTRACT

A metastability filtering circuit comprising: a sampling circuit for sampling a first clock signal with a second clock signal to produce a sampled first clock signal, the first clock signal being synchronous to an interface between first and second systems; an edge detection circuit coupled to the sampling circuit for receiving the sampled first clock signal and for producing a rate adapted first clock signal; a delay circuit coupled to the edge detection circuit for receiving the rate adapted first clock signal and for producing first and second clock enable signals, the second clock enable signal being a delayed version of the first clock enable signal; and, a shift register clocked by the second clock signal and having first and second sequential registers enabled by the first and second clock enable signals, respectively, for receiving an input signal from the first system at the first register and providing a filtered output signal to the second system from the second register, wherein the filtered output signal is provided within one cycle of the first clock signal thereby providing zero clock delay between the input and filtered output signals.

26 Claims, 3 Drawing Sheets

US 7,288,969 B1

ZERO CLOCK DELAY METASTABILITY FILTERING CIRCUIT

FIELD OF THE INVENTION

This invention relates to the field of metastability filtering, and more specifically, to metastability filtering for devices having multiple reset domains.

BACKGROUND OF THE INVENTION

In electronic circuits, metastability refers to the persistence of a non-equilibrium electronic state for an extended period of time (i.e., for longer than a clock cycle). For example, a flip-flop is an electronic device that may suffer from metastability. It has two well-defined stable states, traditionally designated 0 (e.g., 0 to 0.8 volts for TTL) and 1 (e.g., 2.4 to 5 volts for TTL), but under certain conditions it can hover between (e.g., 0.8 to 2.4 volts for TTL) them for longer than a clock cycle.

For example, in a communications network, a digital subscriber line ("DSL") access multiplexer ("DSLAM") is a device that serves as a point of interface between a number of subscriber premises and a carrier network. It is a packet multiplexer, serving to multiplex data packets from multiple customers in order to transmit them over one or more high-speed circuits. A hybrid IP/ATM DSLAM supports both Internet Protocol ("IP") and Asynchronous Transfer Mode ("ATM") networks. In a hybrid IP/ATM DSLAM, the IP and ATM sides of the DSLAM may be treated as two independent systems each with its own independent asynchronous reset. When one side (e.g., the IP system) of the hybrid DSLAM resets it is often not desirable to require the other side (e.g., the ATM system) to also reset. When a reset of one side of the hybrid DSLAM occurs, all synchronous interfaces between, the two sides of the hybrid DSLAM are subject to a potential meta-stability event. This occurs because when a first system (e.g., the IP system) is reset, traditionally, the reset is applied asynchronously and the interfaces to the system change state asynchronously, thus having the potential to violate set-up or hold times for signals at the far end of the interface coupled to a second system (e.g., the ATM system) which is not being reset. This can lead to a meta-stable event in the second system (e.g., the ATM system) which is not reset, possibly resulting in a finite state machine entering an undefined state from which it can not recover without also being reset. For reference, the expression "set-up time" refers to the time required for the input signal at a flip-flop to be valid before the incoming clock edge arrives. And, the expression "hold time" refers to the time required for the input data signal to remain valid after the clock edge has transitioned.

Note that unlike hybrid IP/ATM DSLAMs, in traditional IP only and ATM only DSLAMs, synchronous interfaces between devices are in the same reset domain and therefore the problem described above does not typically occur. Synchronous interfaces are based on the inherent assumption that set-up and hold times for the interface will never be violated (this is part of the specification for the interface) and therefore steps are generally not taken within a device to ensure that it can tolerate a setup or hold time violation on an external interface.

FIG. 1 is a block diagram illustrating a metastability filtering circuit 100 in accordance with the prior art. To protect against set-up and hold time violations resulting in a metastable event when signals cross clock domains within a device, the prior art circuit 100 pipelines input signals 110 from a first clock domain using multiple registers (e.g., "D"-type flip-flops) 120, 130 clocked by the second clock domain's clock 140. This technique greatly reduces the probability of set-up and/or hold time violations at the output 150 of the last register stage 130 of the circuit 100, thus reducing the probability of a metastable event affecting a register (not shown) following the last stage 130 in the circuit 100. This circuit is typically used for eliminating (or rendering negligible) metastability in cross-clock domain crossings. Pipeline stages of 2 or 3 registers may be implemented with this type of circuit.

However, the above circuit is not effective for protecting against metastability across a synchronous interface between systems in a device that each have separate reset domains, for the following reasons. First, the interface protocol's response time to changes in input control signals (e.g., an enable signal in a Utopia™ interface) arriving at the interface may be such that delaying control signals for multiple clock cycles through pipelining results in an inability to maintain the interface protocol. Second, many off-the-shelf field programmable gate array ("FPGA") or/application-specific integrated circuit ("ASIC") cores are pre-designed based on the timing/protocol specific for the type of synchronous interface and therefore cannot accept additional delay in signals received from the interface.

A need therefore exists for an improved metastability filtering circuit for devices having multiple reset domains. Accordingly, a solution that addresses, at least in part, the above and other shortcomings is desired.

SUMMARY OF THE INVENTION

According to one aspect of the invention, there is provided a metastability filtering circuit comprising: a sampling circuit for sampling a first clock signal with a second clock signal to produce a sampled first clock signal, the first clock signal being synchronous to an interface between first and second systems; an edge detection circuit coupled to the sampling circuit for receiving the sampled first clock signal and for producing a rate adapted first clock signal; a delay circuit coupled to the edge detection circuit for receiving the rate adapted first clock signal and for producing first and second clock enable signals, the second clock enable signal being a delayed version of the first clock enable signal; and, a shift register clocked by the second clock signal and having first and second sequential registers enabled by the first and second clock enable signals, respectively, for receiving an input signal from the first system at the first register and providing a filtered output signal to the second system from the second register, wherein the filtered output signal is provided within one cycle of the first clock signal thereby providing zero clock delay between the input and filtered output signals.

In the above metastability filtering circuit, the sampling circuit may be a shift register clocked by the second clock signal and may have first and second sequential registers. The first and second registers of this shift register may be D-type flip-flops. The edge detection circuit may be a one-shot circuit including a register clocked by the second clock signal, an inverter gate coupled to an output of the register, and an AND gate coupled to an input of the register and the output of the inverter gate. The register of the edge detection circuit may be at least one sequential D-type flip-flop. The delay circuit may be a shift register clocked by the second clock signal and having one or more sequential registers. The one or more registers of the delay circuit may be D-type flip-flops. The first and second clock signals may have first and second frequencies, respectively, and the second frequency may be higher than the first frequency. The second frequency may be at least fourfold that of the first frequency. The first and second systems may be included in a single device. The interface may be a synchronous interface. The first and second systems may have respective reset domains. And, the device may be a hybrid IP/ATM DSLAM and the first and second systems may be IP and ATM systems of the hybrid DSLAM.

BRIEF DESCRIPTION OF THE DRAWINGS

Features and advantages of the embodiments of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENTS

In the following description, details are set forth to provide an understanding of the invention. In some instances, certain instruction modules, circuits, structures and techniques have not been described or shown in detail in order not to obscure the invention.

The present invention provides a circuit that uses an asynchronous clock to perform metastability filtering of signals into a slower clock domain which cannot use the traditional metastability filtering method of multiple register stages clocked by the receiving clock domain. The present invention may be used for metastability filtering of input signals to an FPGA or ASIC which is being driven by another device which is reset on a separate asynchronous reset domain, such as is the case when passing traffic between the IP and ATM sides of a Hybrid IP/ATM DSLAM.

Figure 1:
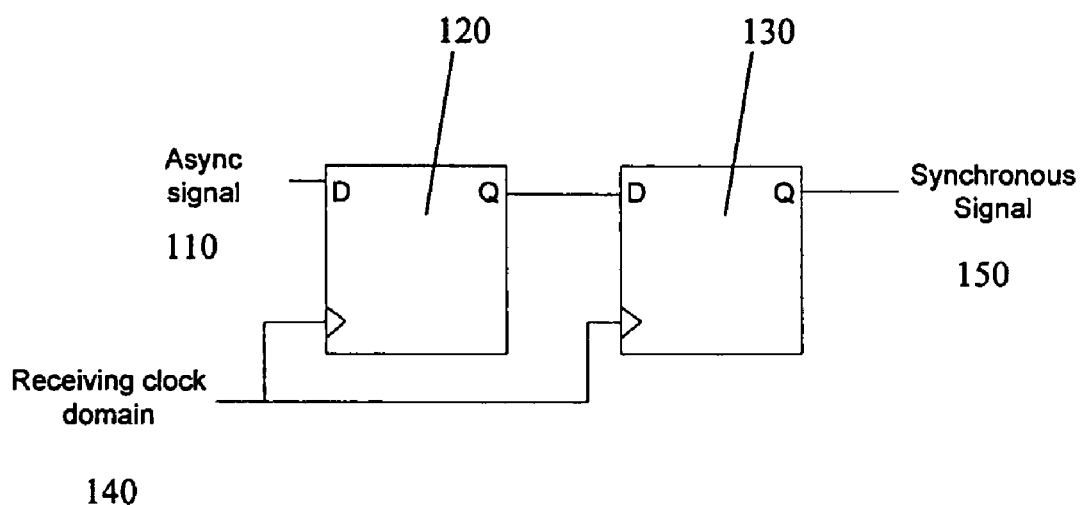
FIG. 1 is a block diagram illustrating a metastability filtering circuit in accordance with the prior art.
Figure 2:
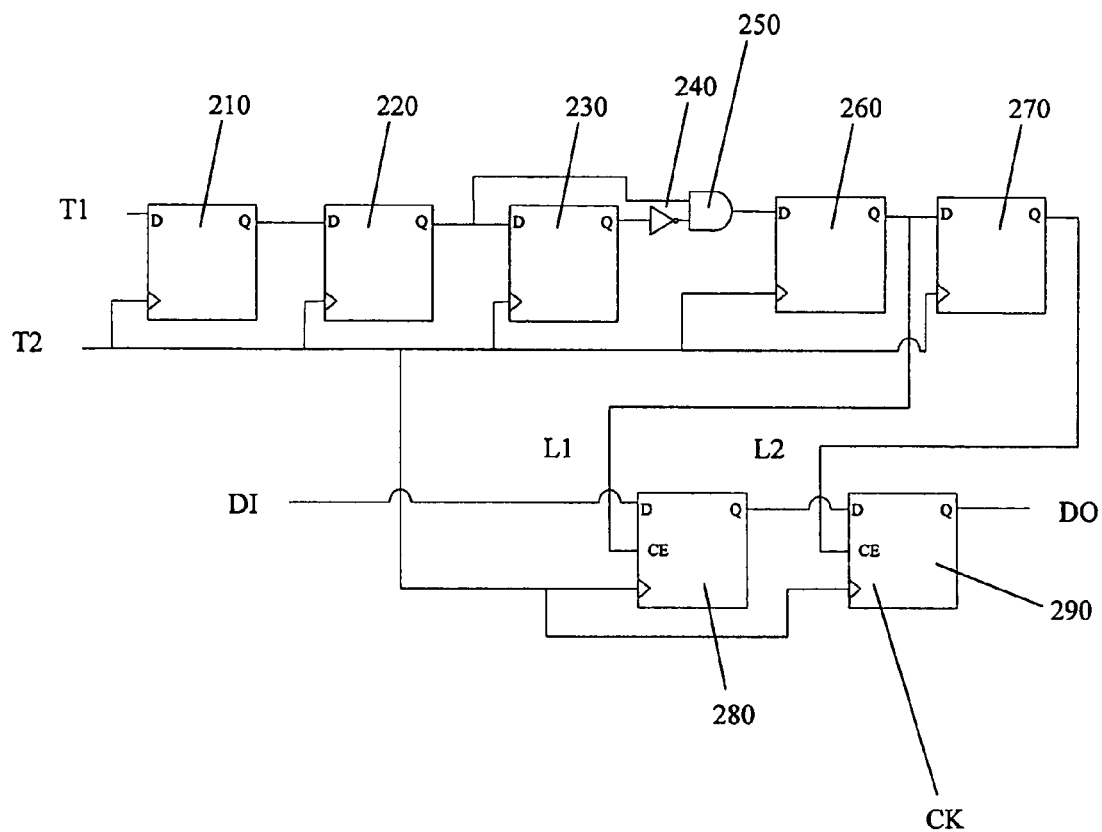
FIG. 2 is a block diagram illustrating a metastability filtering circuit in accordance with an embodiment of the invention; and, FIG. 3 is a block diagram illustrating a device incorporating the metastability filtering circuit of FIG. 2 in accordance with an embodiment of the invention.
Figure 3:
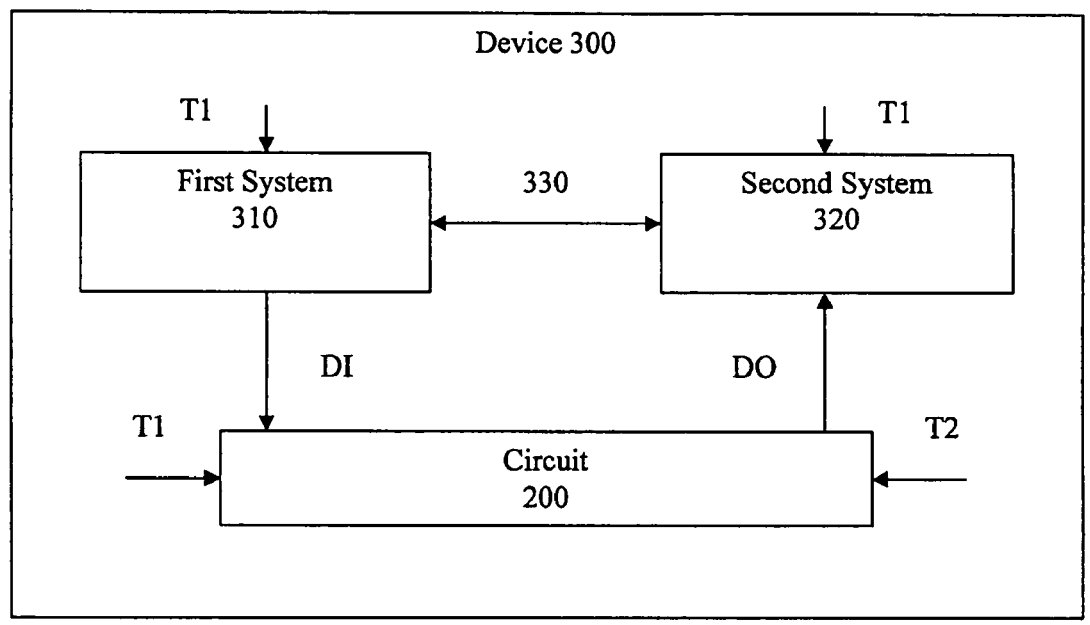

FIG. 2 is a block diagram illustrating a metastability filtering circuit 200 in accordance with an embodiment of the invention. And, FIG. 3 is a block diagram illustrating a device 300 incorporating the metastability filtering circuit 200 of FIG. 2 in accordance with an embodiment of the invention. The metastability filtering circuit 200 of the present invention may be installed in a device 300 having first and second systems 310, 320. Each of the first and second systems 310, 320 has a respective reset domain. The systems 310, 320 are coupled by a synchronous interface 330. The device 300 has a first clock signal T1 that is provided to the both the first and second systems 310, 320 and to the circuit 200. In addition, the first system 310 provides input signals DI to the circuit 200. The circuit 200 filters the input signals DI and provides output signals DO to the second system 320. Of course, the input signals DI may be provided by the second system 320 and the filtered output signals DO may be provided to the first system 310. The circuit 200 may be considered to be a part of the interface 330. The input signals DI may include data signals. A second clock signal T2 is provided to the circuit 200 from an oscillator or other source (not shown) within or external to the device 300. The second clock signal T2 has a higher frequency than the first clock signal T1. For example, T2 may have a frequency of 125 MHz compared to a frequency of 8.25 MHz for T1. The frequency of T2 may be selected in accordance with timing margins dictated by the frequency of T1, the components of the circuit 200, and the components of the first and second systems 310, 320. The metastability filtering circuit 200 provides protection against metastable events due to an asynchronous device reset on the synchronous interface 330 between the systems 310, 320.

According to one embodiment, the device 300 may be a hybrid IP/ATM DSLAM and the first and second systems 310, 320 may be an IP system and an ATM system within the hybrid DSLAM.

According to one embodiment, the metastability filtering circuit 200 includes seven D-type positive (i.e., rising) edge triggered flip-flop circuits 210, 220, 230, 260, 270, 280, 290, an "AND" gate 250, and an inverter gate 240. Each flip-flop (e.g., 290) includes a data input D, an output Q, and a clock input (e.g., CK). Some flip-flops (i.e., 280, 290) also include a clock enable input CE. The logic value at a flip-flop's D input when a clock signal CK occurs is stored in the flip-flop 290. If the stored value is equal to 1 (i.e., Q=1), the flip-flop is "set". If the stored value is equal to 0 (i.e., Q=0), the flip-flop is "cleared". An edge triggered D-type flip-flop 290 latches the logic value at the D input during the clock pulse's CK transition from one logic value to the other. Positive edge triggered flip-flops 290 latch on the positive transition of the clock CK. The enable input CE allows the flip-flop 290 to be in a holding state. When the enable input CE is equal to 1 (i.e., CE=1), the value of D determines the value of Q. When the enable input CE is equal to 0 (i.e., CE=0), the most recent input D is remembered, that is, output Q does not change.

The circuit 200 consists of multiple stages or portions. In the first stage, the clock T1 associated with the synchronous interface 330 and the first system 310 is over-sampled and rate adapted through a traditional metastability filtering circuit 210, 220 to a much faster asynchronous clock T2. The rate adapted clock (i.e., at output Q of flip-flop 220) is then edge detected 230, 240, 250, in this particular case rising edge detected, and then delayed 260, 270 by subsequent clock cycles of the second clock T2 to generate two clock enable CE signals L1, L2. Note that the delay circuit 260, 270 may consist of any number of flip-flop stages for adjusting the delay with the last two stages being used to generate L1 and L2. The delay circuit 260, 270 may consist of a single flip-flop (e.g., 260) in which case L1 would be taken from the output of the AND gate 250 and L2 would be taken from the output Q of the single flip-flop 260.

The final stage of the circuit 200 provides metastability filtering 280, 290 of the input signal DI (or signals) from the synchronous interface 330 to the much faster asynchronous clock T2 using L1 and L2 as the signals which gate when the input signal DI is sampled.

The circuit 200 provides an output signal DO (or signals) which is rate adapted to the over-sampling second clock T2 and is synchronous to the much slower interface clock T1. This output signal DO can then be fed directly into logic 320 clocked by T1 without the risk of violating set-up or hold times on the next register. In addition, because T2 is a much faster clock than T1, the output signal DO is delayed by less than 1 clock cycle of T1 relative to the input signal DI from the synchronous interface 330. In effect, there is a net overall delay of zero clock cycles with respect to T1.

Additional sequential delay (e.g., additional flip-flops and/or inverter gates) can be added to the meta-stability filtering/edge detection circuit 230, 240, 250 to adjust the timing of L1. This would allow for the effective external set-up and hold time of input DI with respect to clock T2.

Note that the second sampling stage 290 of input DI (which is enabled by L2) may be omitted if the output DO only feeds a single flip-flop in the downstream logic (e.g., 320).

According to one embodiment, the present invention may be implemented within the system (e.g., 320) containing the downstream receiving logic. According to another embodiment, the present invention may be implemented external to the system 320 containing the downstream receiving logic, that is, as shown in FIG. 3. External implementation may be useful in cases where the receiving logic (e.g., 320) is implemented in an off-the-shelf ASIC.

The present invention provides several advantages. First, it provides meta-stability protection for external synchronous interfaces 330 which are subject to independent asynchronous resets. Second, it does not add pipeline delay which is associated with traditional metastability filtering circuits, therefore preserving the protocol timing associated with the external interface 330. Third, the output signal DO (or signals) can be fed directly into an off-the-shelf interface IP core because the interface protocol is maintained (i.e., no additional clock delay is introduced by pipeline stages). Fourth, it allows a hybrid IP/ATM DSLAM to use independent reset domains for each of its IP and ATM sides (e.g., 310, 320) while providing metastability protection on the interface(s) 330 between them in the event that only one side of the hybrid DSLAM is reset. Hybrid IP/ATM DSLAMs which do not include metastability protection on their synchronous interfaces which cross independent reset domains may have lower quality of service since on some occasions when a reset occurs on one side of the DSLAM it will require the other side to also be reset before communication/traffic between both sides of the DSLAM can resume. Fifth, the present invention is not limited to application in hybrid IP/ATM DSLAMs. Rather, the present invention may be applied to any device in which a synchronous interface crosses independent reset domains.

Thus, according to one aspect of the invention, there is provided a metastability filtering circuit 200 comprising: a sampling circuit 210, 220 for sampling a first clock signal T1 with a second clock signal T2 to produce a sampled first clock signal (i.e., at the output Q of the register 220), the first clock signal T1 being synchronous to an interface 330 between first and second systems 310, 320; an edge detection circuit 230, 240, 250 coupled to the sampling circuit 220 for receiving the sampled first clock signal and for producing a rate adapted first clock signal (i.e., at the input D of the register 260); a delay circuit 260, 270 coupled to the edge detection circuit 250 for receiving the rate adapted first clock signal and for producing first and second clock enable signals L1, L2, the second clock enable signal L2 being a delayed version of the first clock enable signal L1; and, a shift register 280, 290 clocked by the second clock signal T2 and having first and second sequential registers 280, 290 enabled by the first and second clock enable signals L1, L2, respectively, for receiving an input signal DI from the first system 310 at the first register 280 and providing a filtered output signal DO to the second system 320 from the second register 290, wherein the filtered output signal DO is provided within one cycle of the first clock signal T1 thereby providing zero clock delay between the input and filtered output signals DI, DO.

In the above metastability filtering circuit 200, the sampling circuit 210, 220 may be a shift register 210, 220 clocked by the second clock signal T2 and may have first and second sequential registers 210, 220. The first and second registers 210, 220 of this shift register may be D-type flip-flops. The edge detection circuit 230, 240, 250 may be a one-shot circuit 230, 240, 250 including a register 230 clocked by the second clock signal T2, an inverter gate 240 coupled to an output of the register 230, and an AND gate 250 coupled to an input of the register 230 and the output of the inverter gate 240. The register 230 of the edge detection circuit 230, 240, 250 may be at least one sequential D-type flip-flop. The delay circuit 260, 270 may be a shift register 260, 270 clocked by the second clock signal T2 and having one or more sequential registers 260, 270. The one or more registers 260, 270 of the delay circuit 260, 270 may be D-type flip-flops. The first and second clock signals T1, T2 may have first and second frequencies, respectively, and the second frequency may be higher than the first frequency. The second frequency may be at least fourfold that of the first frequency. The first and second systems 310, 320 may be included in a single device 300. The interface 330 may be a synchronous interface 330. The first and second systems 310, 320 may have respective reset domains. And, the device 300 may be a hybrid IP/ATM DSLAM and the first and second systems 310, 320 may be IP and ATM systems of the hybrid DSLAM.

The embodiments of the invention described above are intended to be exemplary only. Those skilled in this art will understand that various modifications of detail may be made to these embodiments, all of which come within the scope of the invention.

What is claimed is:

1. A metastability filtering circuit comprising:
a sampling circuit for sampling a first clock signal with a second clock signal to produce a sampled first clock signal, the first clock signal being synchronous to an interface between first and second systems;
an edge detection circuit coupled to the sampling circuit for receiving the sampled first clock signal and for producing a rate adapted first clock signal;
a delay circuit coupled to the edge detection circuit for receiving the rate adapted first clock signal and for producing first and second clock enable signals, the second clock enable signal being a delayed version of the first clock enable signal; and,
a shift register clocked by the second clock signal and having first and second sequential registers enabled by the first and second clock enable signals, respectively, for receiving an input signal from the first system at the first register and providing a filtered output signal to the second system from the second register, wherein the filtered output signal is provided within one cycle of the first clock signal thereby providing zero clock delay between the input and filtered output signals.

2. The metastability filtering circuit of claim 1 wherein the sampling circuit is a shift register clocked by the second clock signal and having first and second sequential registers.

3. The metastability filtering circuit of claim 2 wherein the first and second registers are D-type flip-flops.

4. The metastability filtering circuit of claim 1 wherein the edge detection circuit is a one-shot circuit including a register clocked by the second clock signal, an inverter gate coupled to an output of the register, and an AND gate coupled to an input of the register and the output of the inverter gate.

5. The metastability filtering circuit of claim 4 wherein the register is at least one sequential D-type flip-flop.

6. The metastability filtering circuit of claim 1 wherein the delay circuit is a shift register clocked by the second clock signal and having one or more sequential registers.

7. The metastability filtering circuit of claim 6 wherein the one or more registers are D-type flip-flops.

8. The metastability filtering circuit of claim 1 wherein the first and second clock signals have first and second frequencies, respectively, and wherein the second frequency is higher than the first frequency.

9. The metastability filtering circuit of claim 8 wherein the second frequency is at least fourfold that of the first frequency.

10. The metastability filtering circuit of claim 1 wherein the first and second systems are included in a single device.

11. The metastability filtering circuit of claim 10 wherein the interface is a synchronous interface.

12. The metastability filtering circuit of claim 11 wherein the first and second systems have respective reset domains.

13. The metastability filtering circuit of claim 12 wherein the device is a hybrid IP/ATM DSLAM and the first and second systems are IP and ATM systems of the hybrid DSLAM.

14. A method for preventing metastability on an interface between first and second systems caused by an asynchronous reset, the method comprising:
    providing a metastability filtering circuit between the first and second systems, wherein the metastability filtering circuit comprises:
    a sampling circuit for sampling a first clock signal with a second clock signal to produce a sampled first clock signal, the first clock signal being synchronous to the interface between the first and second systems;
    an edge detection circuit coupled to the sampling circuit for receiving the sampled first clock signal and for producing a rate adapted first clock signal;
    a delay circuit coupled to the edge detection circuit for receiving the rate adapted first clock signal and for producing first and second clock enable signals, the second clock enable signal being a delayed version of the first clock enable signal; and,
    a shift register clocked by the second clock signal and having first and second sequential registers enabled by the first and second clock enable signals, respectively, for receiving an input signal from the first system at the first register and providing a filtered output signal to the second system from the second register, wherein the filtered output signal is provided within one cycle of the first clock signal thereby providing zero clock delay between the input and filtered output signals.

15. The method of claim 14 wherein the sampling circuit is a shift register clocked by the second clock signal and having first and second sequential registers.

16. The method of claim 15 wherein the first and second registers are D-type flip-flops.

17. The method of claim 14 wherein the edge detection circuit is a one-shot circuit including a register clocked by the second clock signal, an inverter gate coupled to an output of the register, and an AND gate coupled to an input of the register and the output of the inverter gate.

18. The method of claim 17 wherein the register is at least one sequential D-type flip-flop.

19. The method of claim 14 wherein the delay circuit is a shift register clocked by the second clock signal and having one or more sequential registers.

20. The method of claim 19 wherein the one or more registers are D-type flip-flops.

21. The method of claim 14 wherein the first and second clock signals have first and second frequencies, respectively, and wherein the second frequency is higher than the first frequency.

22. The method of claim 21 wherein the second frequency is at least fourfold that of the first frequency.

23. The method of claim 14 wherein the first and second systems are included in a single device.

24. The method of claim 23 wherein the interface is a synchronous interface.

25. The method of claim 24 wherein the first and second systems have respective reset domains.

26. The method of claim 25 wherein the device is a hybrid IP/ATM DSLAM and the first and second systems are IP and ATM systems of the hybrid DSLAM.

* * * * *